US012601783B2

(12) United States Patent
Ruengeler et al.

(10) Patent No.: US 12,601,783 B2
(45) Date of Patent: Apr. 14, 2026

(54) MEASUREMENT SYSTEM

(71) Applicant: Rohde & Schwarz GmbH & Co. KG, Munich (DE)

(72) Inventors: Matthias Ruengeler, Munich (DE); Gregor Feldhaus, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 154 days.

(21) Appl. No.: 18/518,053

(22) Filed: Nov. 22, 2023

(65) Prior Publication Data

US 2025/0164553 A1     May 22, 2025

(51) Int. Cl.
   *G01R 31/308*          (2006.01)
(52) U.S. Cl.
   CPC .................................. *G01R 31/308* (2013.01)
(58) Field of Classification Search
   CPC ...................................................... G01R 31/308
   See application file for complete search history.

(56) References Cited

U.S. PATENT DOCUMENTS 8,467,746 B2     6/2013  Baumgartner et al.
10,432,212 B2 *  10/2019  Tang ...................... H03M 1/125

| | | | | |
|---|---|---|---|---|
| 2017/0207646 A1 * | 7/2017 | Boss | ...................... | H02J 7/0048 |
| 2019/0305790 A1 * | 10/2019 | Kinyua | ................ | H03M 1/0612 |
| 2022/0116049 A1 * | 4/2022 | McPhalen | ........... | H03M 1/1023 |
| 2023/0054999 A1 * | 2/2023 | Chakraborty | ............ | H03C 3/40 |
| 2023/0092327 A1 * | 3/2023 | Bonaguide | ......... | G01R 29/0814 |
| | | | | 324/95 |
| 2024/0106551 A1 * | 3/2024 | Ku | ..................... | H04B 17/3912 |

* cited by examiner

*Primary Examiner* — Lee E Rodak
*Assistant Examiner* — Zannatul Ferdous
(74) *Attorney, Agent, or Firm* — CHRISTENSEN O'CONNOR JOHNSON KINDNESS PLLC

(57)          ABSTRACT

A measurement system is described. The measurement system includes at least one analog-to-digital converter (ADC), the at least one ADC being configured to receive and digitize a radio frequency (RF) signal, thereby obtaining a digitized RF signal. The measurement system further includes a digital signal processing circuit, the digital signal processing circuit being configured to receive and process the digitized RF signal. In some embodiments, the digital signal processing circuit is configured to: determine whether the at least one ADC is operated in an overload operating state based on the digitized RF signal; determine at least one time frame of the digitized RF signal in which the at least one ADC is operated in the overload operating state; and determine whether the at least one time frame corresponds to a critical portion of the RF signal or to an uncritical portion of the RF signal.

17 Claims, 2 Drawing Sheets preamble    payload portion

MEASUREMENT SYSTEM

FIELD OF THE DISCLOSURE

Embodiments of the present disclosure generally relate to a measurement system.

BACKGROUND

When configuring electronic communication devices or after the production of the electronic communication devices, measurements have to be performed in order to assess the performance of the electronic communication devices. Usually, the goal of these measurements is to minimize measurement errors by maximizing a signal power level within the measurement instrument without overloading an analog-to-digital converter (ADC). This requires a precise leveling of an input signal applied to the ADC.

Some communication standards, e.g. WLAN 802.11, have signal portions that spike in signal power. In order to avoid overload at the ADC, the input signal has to be attenuated by several dB, which may impair the signal quality and thus the accuracy of the measurement results considerably.

Thus, there is a need for a measurement system that allows for more precise measurements.

SUMMARY

The following summary of the present disclosure is intended to introduce different concepts in a simplified form that are described in further detail in the detailed description provided below. This summary is neither intended to denote essential features of the present disclosure nor shall this summary be used as an aid in determining the scope of the claimed subject matter.

Embodiments of the present disclosure provide a measurement system. In an embodiment, the measurement system comprises at least one analog-to-digital converter (ADC), the at least one ADC being configured to receive and digitize a radio frequency (RF) signal, thereby obtaining a digitized RF signal. The measurement system also may comprise a digital signal processing circuit, the digital signal processing circuit being configured to receive and process the digitized RF signal. The digital signal processing circuit is configured to determine whether the at least one ADC is operated in an overload operating state based on the digitized RF signal. The digital signal processing circuit further is configured to determine at least one time frame of the digitized RF signal in which the at least one ADC is operated in the overload operating state. The digital signal processing circuit further is configured to determine whether the at least one time frame corresponds to a critical portion of the RF signal or to an uncritical portion of the RF signal.

As used herein, the term "critical portion of the RF signal" is understood to denote a portion of the RF signal that is relevant for the integrity of data to be transmitted via the RF signal. Likewise, as used herein, the term "uncritical portion of the RF signal" is understood to denote a portion of the RF signal that is not relevant for the integrity of data to be transmitted via the RF signal.

For example, in the standard WLAN 802.11, the preamble of the RF signal is not relevant for the integrity of the data to be transmitted, but a payload portion of the RF signal is relevant for the integrity of data to be transmitted. Accordingly, in this particular example, the payload portion corresponds to a critical portion of the RF signal, while the preamble corresponds to an uncritical portion of the RF signal.

Further, the term "overload operating state" is understood to denote an operating state of the at least one ADC in which a power level of the RF signal applied to the at least one ADC exceeds an admissible power level of the ADC. This may result in clipping and/or non-linear distortions of the digitized RF signal.

The measurement system according to embodiments of the present disclosure is based on the idea to identify the critical portions and the uncritical portions of the RF signal before adapting the operational parameters of the electronic components of the measurement system, for example of the at least one ADC, for performing measurements on the RF signal.

Accordingly, the measurements, for example operational parameters associated with the measurements to be performed, can be adapted based on the identified critical and uncritical portions of the RF signal, as is described in more detail hereinafter.

This way, optimal operational parameters of the measurement system, for example of the at least one ADC, can be set. Thus, the measurement system according to embodiments of the present disclosure allows for an optimized measurement setup with enhanced measurement accuracy.

According to an aspect of the present disclosure, the digital signal processing circuit is configured, for example, to determine whether the at least one time frame corresponds to a preamble. As already mentioned above, at least in certain communication standards the preamble corresponds to an uncritical portion of the RF signal. Thus, by determining that the at least one time frame corresponds to a preamble, the digital signal processing circuit may determine that the at least one time frame corresponds to an uncritical portion of the RF signal.

It is noted that, depending on the communication standard employed, the preamble may also be called a "syncword", a "sync character", or a "sync sequence".

In an embodiment of the present disclosure, the digital signal processing circuit is configured to demodulate the digitized RF signal in order to determine whether the at least one time frame corresponds to a critical portion of the RF signal or to an uncritical portion of the RF signal. For example, by demodulating the digitized RF signal, the digital signal processing circuit may determine which portions of the RF signal corresponds to a preamble and which portions of the RF signal correspond to a payload portion of the RF signal.

Accordingly, the digital signal processing circuit may be configured to determine whether the at least one time frame corresponds to a preamble or to a payload portion based on the demodulated digitized RF signal.

According to another aspect of the present disclosure, the digital signal processing circuit comprises, for example, a headroom detection circuit, wherein the headroom detection circuit is configured to determine an overload magnitude in the at least one time frame. In general, the headroom detection circuit allows to assess a severity of an overload of the ADC in the at least one time frame.

Accordingly, the operational parameters of the measurement system may be adjusted based on the determined overload magnitude, thereby further enhancing the measurement accuracy.

In another embodiment of the present disclosure, the digital signal processing circuit is configured to determine whether the determined overload magnitude requires an enhanced attenuation of the RF signal. For example, a certain amount of overload may be acceptable if the at least one time frame corresponds to an uncritical portion of the RF signal, such as to a preamble. In this case, no enhanced attenuation may be necessary. If, however, the at least one time frame corresponds to a critical portion of the RF signal, an enhanced attenuation may be necessary in order to avoid an overload of the at least one ADC in the critical portions of the RF signal.

A further aspect of the present disclosure provides that the digital signal processing circuit is configured, for example, to determine whether the at least one time frame corresponds to a critical portion of the digitized RF signal or to an uncritical portion of the digitized RF signal based on a communication standard on which the RF signal is based. In general, the communication standard specifies the portions of the RF signal that are used for data transmission and are thus relevant for the integrity of the data to be transmitted.

In some embodiments, the digital signal processing circuit may be configured to determine the communication standard on which the RF signal is based, e.g. by demodulating the digitized RF signal.

Alternatively or additionally, the digital signal processing circuit may have a priori knowledge of the communication standard on which the RF signal is based. For example, a user may input the communication standard via a suitable user interface of the measurement system.

In some embodiments, the digital signal processing circuit may be configured to determine at least one figure of merit of the RF signal based on the digitized RF signal. In general, the at least one figure of merit is indicative of a signal quality and/or signal integrity of the digitized RF signal.

In some embodiments, the at least one figure of merit may be a measure for a performance of an electronic device under test generating the RF signal. Thus, by determining the at least one figure of merit, the performance of the device under test may be assessed.

For example, the at least one figure of merit comprises an error vector magnitude (EVM). However, it is to be understood that the at least one figure of merit may comprise any other suitable quantity.

In an embodiment of the present disclosure, the digital signal processing circuit is configured to discard portions of the digitized RF signal that correspond to the at least one time frame for determining the at least one figure of merit. In other words, portions of the digitized RF signal for which the at least one ADC has been operated in an overloaded operating state may be discarded for determining the at least one figure of merit, such that additional disturbances caused by the measurement system or by the at least one ADC do not influence the accuracy of the at least one figure of merit. Thus, the measurement accuracy is further enhanced.

In some embodiments, the digital signal processing circuit may be configured to discard portions of the digitized RF signal that correspond to the at least one time frame for determining the at least one figure of merit if the at least one time frame corresponds to a uncritical portion of the RF signal.

Another aspect of the present disclosure provides that the digital signal processing circuit is configured, for example, to generate a first warning signal if the at least one time frame is critical for the at least one figure of merit. Thus, a user may be warned via the first warning signal that a performed measurement is invalid if the at least one time frame is critical for the at least one figure of merit.

In some embodiments, the first warning signal may comprise at least one of an acoustic warning signal, a text warning, a warning color, or a warning icon.

Alternatively or additionally, the digital signal processing circuit may be configured to generate a second warning signal if the at least one time frame is uncritical for the at least one figure of merit. According to another example, the digital signal processing circuit is configured to generate no warning signal if the at least one time frame is uncritical for the at least one figure of merit. Thus, a user may be informed via the second warning signal that the at least one ADC has been operated in an overload operating state but that the performed measurement is still valid as the at least one time frame is uncritical for the at least one figure of merit.

In some embodiments, the second warning signal may comprise at least one of an acoustic warning signal, a text warning, a warning color, or a warning icon.

In an embodiment of the present disclosure, the digital signal processing circuit is configured to generate a first warning signal if the at least one time frame is critical for the at least one figure of merit. The digital signal processing circuit is configured to generate a second warning signal if the at least one time frame is uncritical for the at least one figure of merit, wherein the first warning signal is different from the second warning signal. Thus, the first warning signal being associated with a critical overload of the at least one ADC and the second warning signal being associated with an uncritical overload of the at least one ADC are presented to the user in a different fashion. Hence, the user can immediately assess whether the overload of the at least one ADC has impaired the measurements performed or not.

According to an aspect of the present disclosure, the measurement system comprises, for example, at least one adjustable attenuator that is provided upstream of the at least one ADC, wherein the at least one adjustable attenuator is configured to attenuate the RF signal. In some embodiments, the at least one adjustable attenuator may be configured to attenuate the RF signal such that the at least one ADC is operated in a nominal operating state for critical portions of the RF signal. Accordingly, it is ensured that the ADC is not overloaded at the relevant portions of the RF signal, namely the critical portions. Thus, an improved measurement accuracy is provided.

In an embodiment, the signal processing circuit may be configured to control the at least one adjustable attenuator to attenuate the RF signal such that the at least one ADC is operated in a nominal operating state for critical portions of the RF signal. Thus, the signal processing circuit may automatically level the RF signal appropriately. In other words, the measurement system may have an auto-leveling functionality. Accordingly, it is ensured that the ADC is not overloaded at the relevant portions of the RF signal, namely the critical portions, such that an improved measurement accuracy is provided.

In an embodiment of the present disclosure, the measurement system further comprises a user interface, wherein the user interface is configured to receive a user input, and wherein the signal processing circuit is configured to control the at least one adjustable attenuator to attenuate the RF signal based on the received user input. Thus, a user may manually set the attenuation of the RF signal by controlling the at least one adjustable attenuator via the user interface.

Alternatively or additionally, the signal processing circuit may be configured to turn on or off the auto-leveling functionality described above based on the user input.

Alternatively or additionally, the signal processing circuit may be configured to turn on or off overload detection based on the user input.

In some embodiments, the digital signal processing circuit may further comprise a capture buffer, wherein the digital signal processing circuit is configured to indicate overloaded samples in the capture buffer. In other words, samples for which the at least one ADC has been operated in an overload operating state may be marked in the capture buffer.

According to another aspect of the present disclosure, the at least one ADC comprises, for example, a first ADC and a second ADC. The measurement system comprises a first adjustable attenuator that is provided upstream of the first ADC. In some of these embodiments, the measurement system further comprises a second adjustable attenuator that is provided upstream of the second ADC, and wherein the second adjustable attenuator is configured to attenuate the RF signal more than the first adjustable attenuator. In some embodiments, the second adjustable attenuator may be configured to attenuate the RF signal such that the RF signal is applied to the second ADC without overloading the second ADC. A second digitized RF signal generated by the second ADC may be used by the digital signal processing circuit in order to quantify the overload magnitude of the first ADC.

In some embodiments, the second adjustable attenuator may be configured to attenuate the RF signal such that the second ADC is operated in a nominal operating state for all portions of the RF signal.

In some embodiments, the attenuation value, e.g. how much attenuation is applied, may depend on the communication standard, namely in the nominal operating state. For instance, the attenuation value is higher than 1 dB, 2 dB, 3 dB, 4 dB, 5 dB, 6 dB, 7 dB, 8 dB, 9 dB or higher than 10 dB. In other words, the attenuation value may have a lower boundary between 1 dB and 10 dB as indicated before. However, the attenuation value may be lower than 11 dB, 10 dB, 9 dB, 8 dB, 7 dB, 6 dB, 5 dB, 4 dB, 3 dB or lower than 2 dB. In other words, the attenuation value may have an upper boundary between 11 dB and 2 dB as indicated before. Preferably, the attenuation value is between 1 dB and 5 dB.

According to an aspect of the present disclosure, the measurement system comprises, fore example, a measurement instrument, wherein the at least one ADC and the signal processing circuit are integrated into the measurement instrument. Accordingly, a highly integrated measurement system is provided.

In some embodiments, the measurement instrument may comprise an integrated RF frontend that is configured to receive and/or down-convert a frequency of the RF signal.

However, it is to be understood that the measurement system may comprise electronic components and/or electronic devices that are established separately from the measurement instrument, for example an external RF frontend.

In an embodiment of the present disclosure, the measurement instrument is a spectrum analyzer, a signal analyzer, an oscilloscope, or a vector network analyzer. However, it is to be understood that the measurement instrument may be established as any other suitable type of measurement device.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
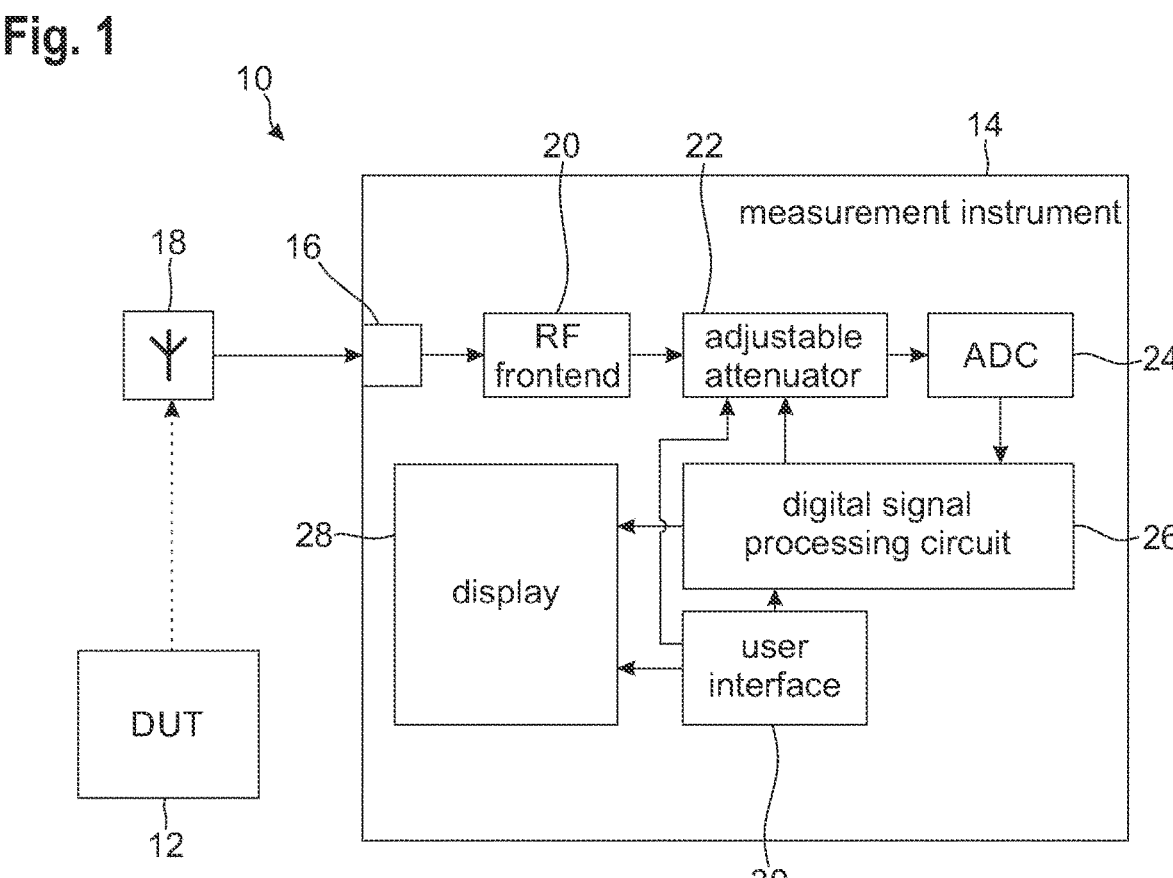
FIG. 1 schematically shows a measurement system according to an embodiment of the present disclosure.

FIG. 1 schematically shows a measurement system 10 comprising a device under test 12 and a measurement instrument 14 in accordance with an embodiment of the present disclosure. In general, the device under test 12 is configured to generate and transmit an RF signal, for example a wireless RF signal.

Without restriction of generality, the exemplary case of the device under test 12 being configured to generate a wireless RF signal is described in the following. For example, the device under test 12 may be established as a wireless communication device, such as a mobile phone, a tablet, a wireless transceiver, a WLAN router, etc. The device under test 12 may employ any suitable wireless communication standard, e.g. WLAN, Bluetooth, near field communication (NFC), LTE, 5G, etc.

In general, the measurement instrument 14 is configured to receive an RF signal from the device under test 12 and to assess a performance of the device under test 12 based on the received RF signal. For example, the measurement instrument 14 may be a spectrum analyzer, a signal analyzer, an oscilloscope, or a vector network analyzer. However, it is to be understood that the measurement instrument 14 may be established as any other suitable type of measurement device.

As shown in FIG. 1, the measurement instrument 14 comprises an RF input 16 that is configured to receive the RF signal. In the example embodiment shown in FIG. 1, the RF input 16 is connected to an external RF antenna 18 that receives the wireless RF signal and converts the wireless RF signal into an electrical RF signal. However, it is to be understood that the RF antenna 18 may also be integrated into the measurement instrument 14.

In an embodiment, the measurement instrument 14 may further comprise an RF frontend 20 that is connected with the RF input 16. In general, the RF frontend 20 is configured to down-convert a frequency of the RF signal to an intermediate frequency (IF) that is suitable for processing of the RF signal by the further components provided downstream of the RF frontend 20.

As usual, the RF frontend 20 may comprise local oscillator being configured to generate a local oscillator (LO) signal, and a mixer circuit being configured to down-convert the frequency of the RF signal by mixing the RF signal with the LO signal and filtering the resulting mixed signal by a band-pass filter or a low-pass filter.

It is noted that in the following, the term "RF signal" is being used for the original RF signal and also for the RF signal being down-converted in frequency.

Downstream of the RF frontend 20, an adjustable attenuator 22 is provided. In general, the adjustable attenuator 22 is configured to attenuate the RF signal by a certain attenuation factor, wherein the attenuation factor is adjustable.

In the embodiment shown, the measurement instrument 14 further comprises an analog-to-digital converter (ADC) 24 that is provided downstream of the adjustable attenuator 22. The ADC 24 is configured to receive and digitize the RF signal from the adjustable attenuator 22, thereby obtaining a digitized RF signal.

The measurement instrument 14 further comprises a digital signal processing circuit 26 that is connected with the at least one ADC 24 so as to receive the digitized RF signal. In general, the digital signal processing circuit 26 is configured to process the digitized RF signal, thereby obtaining measurement results relating to the RF signal received from the device under test 12, as will be described in more detail below. Optionally, the digital signal processing circuit 26 may be connected with the adjustable attenuator 22.

Downstream of the digital signal processing circuit 26, a display 28 is provided. It is noted that while the display 28 is shown to be integrated into the measurement instrument 14 in FIG. 1, it is also conceivable that the display 28 may be provided separately from the measurement instrument 14.

In some embodiments, the measurement instrument 14 further comprises a user interface 30 that may be connected to the digital signal processing circuit 26, to the adjustable attenuator 22, and/or to the display 28. In general, the user interface 30 is configured to receive a user input from a user, and to adapt operational parameters of the digital signal processing circuit 26, of the adjustable attenuator 22, and/or of the display 28 based on the user input.

Figure 2:
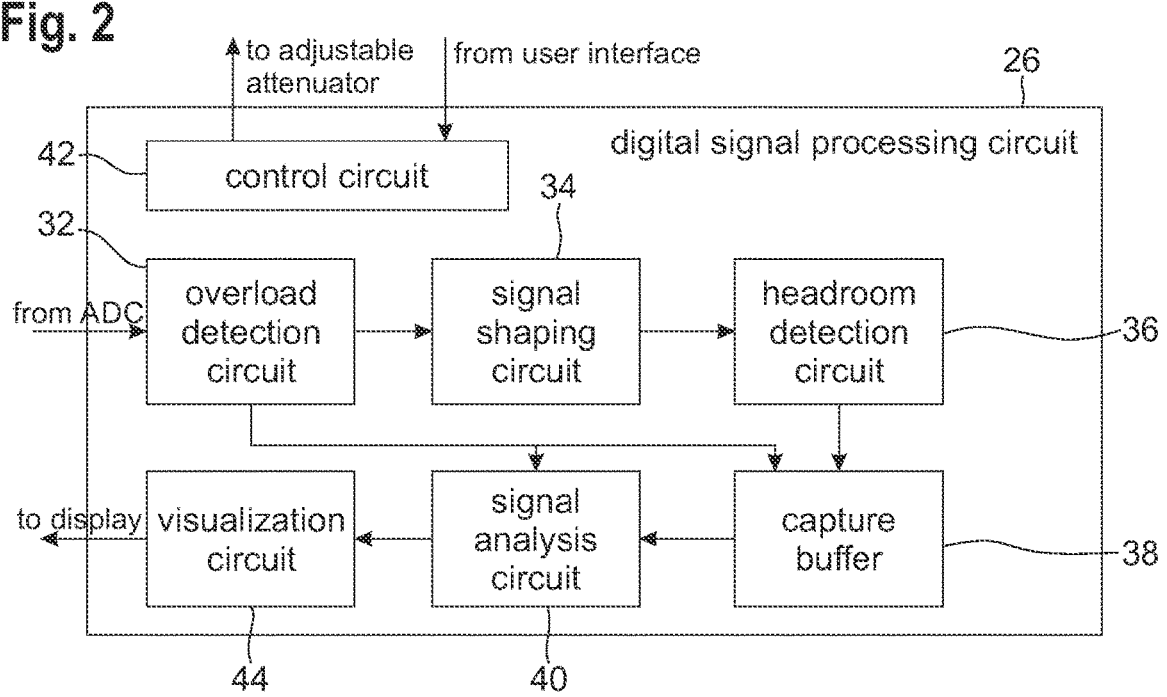
FIG. 2 schematically shows a digital signal processing circuit of the measurement system of FIG. 1 in more detail.

FIG. 2 shows an example of the digital signal processing circuit 26 in more detail. As shown in FIG. 2, the digital signal processing circuit 26 comprises an overload detection circuit 32 that is connected with the ADC 24. The overload detection circuit 32 is configured to determine whether the ADC 24 is operated in an overload operating state based on the digitized RF signal.

In some embodiments, the overload detection circuit 32 may be configured to determine time stamps of the corresponding overloaded samples, i.e. of the samples for which the ADC 24 has been operated in the overload operating state. In some embodiments, the overload detection circuit 32 may only output the time stamps of the first and last overloaded sample. Alternatively, the overload detection circuit 32 may output the time stamps of all detected overloaded samples.

In some embodiments, the overload detection circuit 32 may further be configured to perform a statistical analysis on the digitized RF signal regarding the number or the proportion of overloaded samples.

Optionally, a signal shaping circuit 34 may be provided downstream of the overload detection circuit 32. The signal shaping circuit 34 may be configured to mix, filter, and/or resample the digitized RF signal as appropriate for the particular measurement at hand.

In an embodiment, the digital signal processing circuit 26 may further comprise a headroom detection circuit 36 that is provided downstream of the signal shaping circuit 34. The headroom detection circuit 36 is configured to determine an overload magnitude of the ADC 24 when the ADC 24 is operated in the overload operating state.

In some embodiments, the headroom detection circuit 36 may receive the time stamps of the overloaded samples from the overload detection circuit 32 and may determine the overload magnitude based on the received time stamps, namely only for the actually overloaded samples.

In some embodiments, the headroom detection circuit 36 may comprise a filter circuit, for example a dither-filter. A filter established by the filter circuit may be applied over a plurality of samples of the digitized RF signal.

Alternatively or additionally, the headroom detection circuit 36 may comprise a statistic unit that is configured to determine a true power level of the digitized RF signal.

In the embodiment shown, the digital signal processing circuit 26 may further comprise a capture buffer 38 that is connected with the overload detection circuit 32 and the headroom detection circuit 36. In general, the capture buffer 38 is configured to store the samples of the digitized RF signal at least temporarily. For example, the capture buffer 38 may be established as a ring buffer.

The capture buffer 38 may further receive the time stamps of the overloaded samples from the overload detection circuit 32, and the overloaded samples may be indicated in the capture buffer 38. In other words, the overloaded samples may be marked in the capture buffer 38.

Downstream of the capture buffer 38, a signal analysis circuit 40 is provided. The signal analysis circuit 40 is configured to receive the samples associated with the digitized RF signal from the capture buffer 38. The signal analysis circuit 40 is configured to process the samples associated with the digitized RF signal as described hereinafter.

In some embodiments, the signal analysis circuit 40 is configured to determine at least one time frame of the digitized RF signal in which the ADC 24 has been operated in the overload operating state. For example, the signal analysis circuit 40 may determine the at least one time frame based on the time stamps provided by the overload detection circuit 32 and/or based on the overload magnitude determined by the headroom detection circuit 36.

Further, the signal analysis circuit 40 is configured to determine whether the at least one time frame corresponds to a critical portion of the RF signal or to an uncritical portion of the RF signal. In order to determine whether the at least one time frame corresponds to a critical portion of the RF signal or to an uncritical portion of the RF signal, the signal analysis circuit 40 may be configured to demodulate the digitized RF signal.

In some embodiments, the signal analysis circuit 40 may demodulate the digitized RF signal based on a priori knowledge of the communication standard on which the RF signal is based. For example, a user may input the communication standard via the user interface 30. Alternatively or additionally, the analysis circuit 40 may be configured to automatically recognize the communication standard, for example via a suitable machine learning technique.

In the following, it is assumed without restriction of generality that the analysis circuit 40 demodulates the digitized RF signal, thereby obtaining a demodulated digitized RF signal. Depending on the communication standard, the RF signal usually comprises a preamble and a payload portion. Based on the demodulated digitized RF signal, the signal analysis circuit 40 determines which portions of the RF signal corresponds to a preamble and which portions of the RF signal correspond to a payload portion.

Typically, the preamble corresponds to an uncritical portion, as the preamble is not relevant for the integrity of data to be transmitted via the RF signal. Thus, if the signal analysis circuit 40 determines that the at least one time frame corresponds to a preamble, the signal analysis circuit 40 may determine that the at least one time frame corresponds to an uncritical portion of the RF signal.

In contrast, the payload portion typically corresponds to a critical portion of the RF signal. Thus, if the signal analysis circuit 40 determines that the at least one time frame corresponds to a payload portion, the signal analysis circuit 40 may determine that the at least one time frame corresponds to a critical portion of the RF signal.

Optionally, the signal analysis circuit 40 may further determine whether the overload magnitude determined by the headroom detection circuit 36 requires an enhanced attenuation of the RF signal. For example, a certain amount of overload may be acceptable if the at least one time frame corresponds to an uncritical portion of the RF signal, such as to a preamble. In this case, no enhanced attenuation may be necessary.

If, however, the at least one time frame corresponds to a critical portion of the RF signal, an enhanced attenuation may be necessary in order to avoid an overload of the ADC 24 in the critical portions of the RF signal. In this case, the digital signal processing circuit 26, or more precisely a control circuit 42 of the digital signal processing circuit 26, may automatically control the adjustable attenuator 22 to attenuate the RF signal such that the ADC 24 is operated in a nominal operating state for critical portions of the RF signal.

In alternative or additional embodiments, a user may manually set the attenuation of the RF signal by controlling the adjustable attenuator 22 via the user interface 30.

In some embodiments, the digital signal processing circuit 26 or the signal analysis circuit 40 further is configured to determine at least one figure of merit of the RF signal based on the digitized RF signal, for example based on the demodulated digitized RF signal. In general, the at least one figure of merit is indicative of a signal quality and/or signal integrity of the digitized RF signal. For example, the at least one figure of merit may comprise an error vector magnitude (EVM) and/or any other suitable quantity. For determining the at least one figure of merit, the digital signal processing circuit 26 or the signal analysis circuit 40 may be configured, for example, to discard portions of the digitized RF signal that correspond to the at least one time frame if the at least one time frame corresponds to an uncritical portion of the RF signal.

In some embodiments, the digital signal processing circuit 26 further comprises a visualization circuit 44 that is provided downstream of the signal analysis circuit 40. The visualization circuit 44 is configured to generate visualization data associated with the digitized RF signal and/or associated with the at least one figure of merit. The visualization data may be displayed on the display 28. For example, as is illustrated in FIG. 3, the visualization data may comprise a plot 46 of the digitized RF signal over time.

In this example, the RF signal may be a WLAN signal that may be based on a WLAN standard like WLAN 802.11. As is illustrated in FIG. 3, this standard comprises a preamble with rather high peaks and a payload portion with a substantially flat maximum signal power level.

Figure 3:
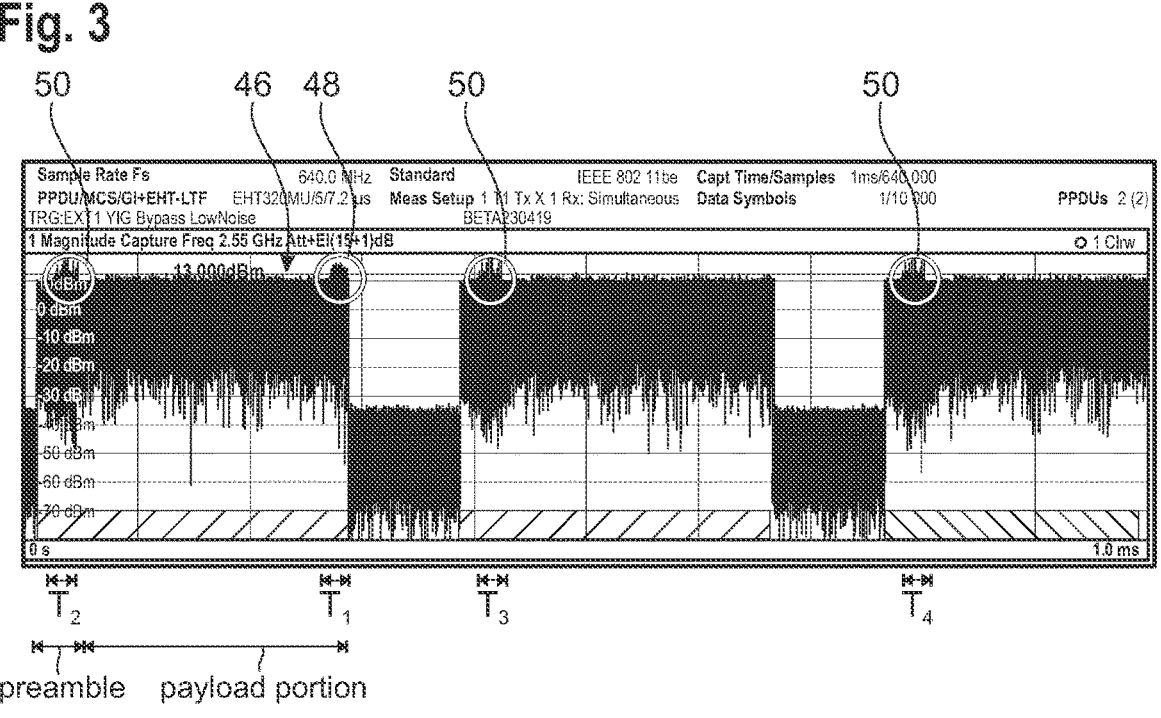
FIG. 3 schematically shows a diagram of measurement results obtained by the measurement system of FIG. 1.

In the example shown in FIG. 3, the signal analysis circuit 40 has determined that the ADC 24 has been operated in an overload operating state in a time frame $T_1$ and that the time frame $T_1$ corresponds to a critical portion of the RF signal, as the time frame $T_1$ is part of a payload portion of the RF signal. Accordingly, the signal analysis circuit 40 may generate a first warning signal, as the time frame $T_1$ is critical for the at least one figure of merit determined.

In the certain example shown in FIG. 3, the first warning signal comprises a colored marker 48 having a first color, for example red, that marks the critical overloaded samples in the plot 46. Alternatively or additionally, the first warning signal may comprise at least one of an acoustic warning signal, a text warning, a warning color, or a warning icon. Thus, a user may be warned via the first warning signal that a performed measurement is invalid if the at least one time frame is critical for the at least one figure of merit.

As is further illustrated in FIG. 3, the signal analysis circuit 40 has determined that the ADC 24 has been operated in an overload operating state in time frames $T_2$, $T_3$, and $T_3$, and that these time frames corresponds to uncritical portions of the RF signal, as these time frames are part of a preamble of the RF signal. The signal analysis circuit 40 may generate a second warning signal being different from the first warning signal for the time frames $T_2$ to $T_4$ that are uncritical for the at least one figure of merit determined.

In the certain example shown in FIG. 3, the second warning signal comprises a colored marker 50 having a second color, for example green, that marks the uncritical overloaded samples in the plot 46. Alternatively or additionally, the second warning signal may comprise at least one of an acoustic warning signal, a text warning, a warning color, or a warning icon. However, in general the second warning signal differs from the first warning signal, e.g. in type, content, color, and/or size.

In a certain example, the visualization data may comprise traffic light indicators, i.e. a green color may indicate no overload at all, a yellow color may indicate a soft overload, i.e. an overload in an uncritical portion, and a red color may indicate a hard overload, i.e. an overload in a critical portion of the RF signal. Alternatively, the signal analysis circuit 40 may generate no warning signal(s) for the time frames corresponding to uncritical portions of the RF signal.

The embodiments of the measurement system 10 described above are understood to be examples, and certain modifications may be provided without departing from the scope of the present disclosure. For example, an external electronic device, such as a further measurement instrument, a personal computer, laptop, a table, a smartphone, or any other type of smart device may be provided.

In some embodiments, the external electronic device may be configured to query the at least one time frame from the digital signal processing circuit 26, and the digital signal processing circuit 26 may be configured to transmit the samples of the digitized RF signal, for example samples corresponding to the at least one time frame, and/or the determined time stamps and/or the determined overload amount to the external electronic device for further processing, e.g. via standard commands for programmable instruments (SCPI).

Figure 4:
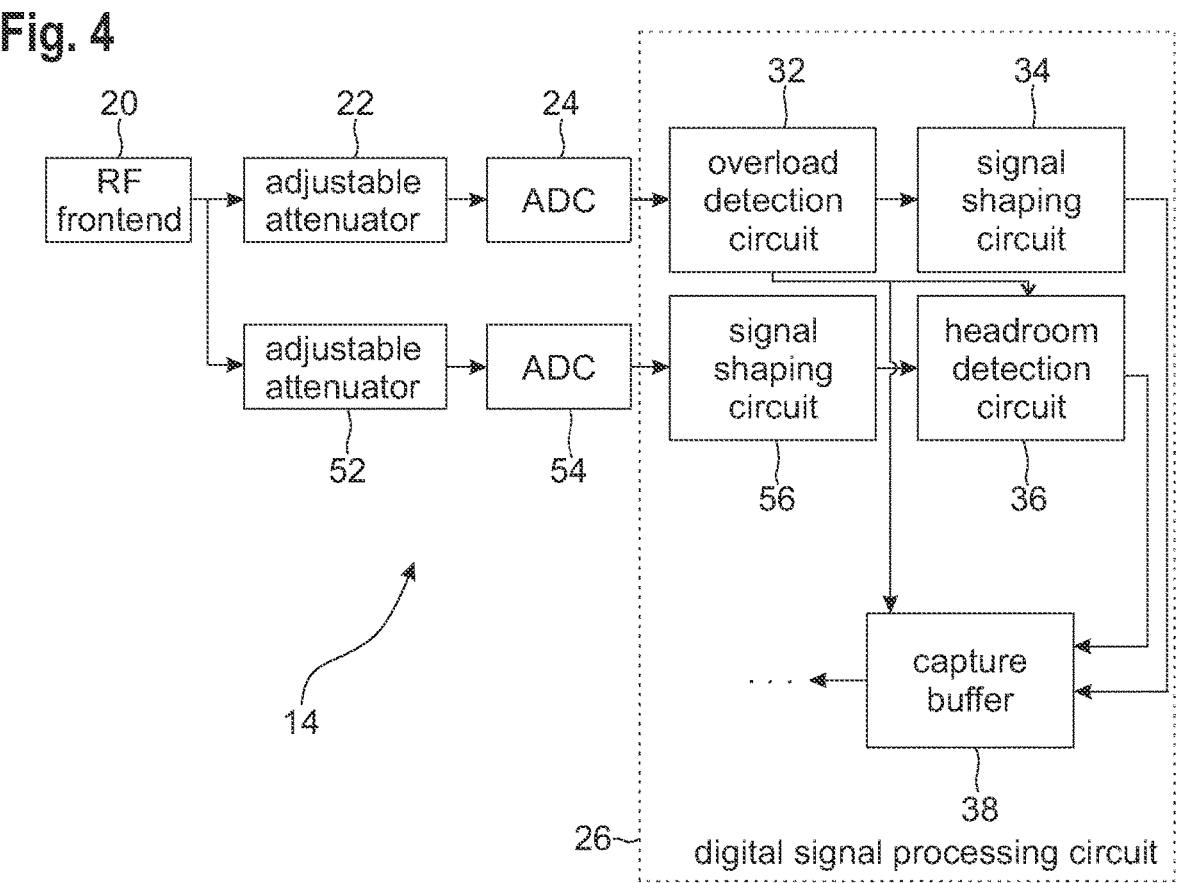
FIG. 4 schematically shows a measurement system according to another embodiment of the present disclosure.

FIG. 4 shows another embodiment of the measurement system 10 or of the measurement instrument 14. In the following, only the differences to the embodiments of FIG. 1 described above are described.

In the example embodiment shown in FIG. 4, the measurement instrument 14 comprises a second adjustable attenuator 52 that is connected to the RF frontend 20, and a second ADC 54 that is connected to the second adjustable attenuator 52. Downstream of the second ADC 54, a second signal shaping circuit 56 is provided that is configured analogously to the signal shaping circuit 34. The headroom detection circuit 36 is provided downstream of the second signal shaping circuit 56.

The second adjustable attenuator 52 receives the same RF signal as the first adjustable attenuator 22. However, in some embodiments, the second adjustable attenuator 52 is configured to attenuate the RF signal more than the first adjustable attenuator 22. In some embodiments, the second adjustable attenuator 52 may be configured to attenuate the RF signal such that the RF signal is applied to the second ADC 54 without overloading the second ADC 54, such that the second ADC 54 is operated in a nominal operating state for all portions of the RF signal.

A second digitized RF signal generated by the second ADC 54 is forwarded to the headroom detection circuit 36. Further, the headroom detection circuit 36 receives the time stamps of the overloaded samples provided by the overload detection circuit 32.

In some embodiments, the headroom detection circuit 36 may determine an overload magnitude of the overloaded samples based on the second digitized RF signal, the attenuation applied by the second adjustable attenuator 52, and the time stamps of the overloaded samples. Otherwise, the explanations given above with respect to embodiments of the measurement system 10 of FIG. 1 likewise apply.

Certain embodiments disclosed herein include systems, apparatus, modules, units, components, etc., that utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

For example, the functionality described herein can be implemented by special purpose hardware-based computer systems or circuits, etc., or combinations of special purpose hardware and computer instructions. Each of these special purpose hardware-based computer systems or circuits, etc., or combinations of special purpose hardware circuits and computer instructions form specifically configured circuits, machines, apparatus, devices, etc., capable of implemented the functionality described herein.

Of course, in some embodiments, two or more of these components, or parts thereof, can be integrated or share hardware and/or software, circuitry, etc. In some embodiments, these components, or parts thereof, may be grouped in a single location or distributed over a wide area. In circumstances where the components are distributed, the components are accessible to each other via communication links.

In some embodiments, one or more of the components, such as one or more of the circuits of system 10, etc., referenced above include circuitry programmed to carry out one or more steps of any of the methods disclosed herein or to carry out any of the functionality described therewith. In some embodiments, one or more computer-readable media associated with or accessible by such circuitry contains computer readable instructions embodied thereon that, when executed by such circuitry, cause the component or circuitry to perform one or more steps of any of the methods disclosed herein or to carry out any of the functionality described therewith.

In some embodiments, the computer readable instructions includes applications, programs, program modules, scripts, source code, program code, object code, byte code, compiled code, interpreted code, machine code, executable instructions, and/or the like (also referred to herein as executable instructions, instructions for execution, program code, computer program instructions, and/or similar terms used herein interchangeably).

In some embodiments, computer-readable media is any medium that stores computer readable instructions, or other information non-transitorily and is directly or indirectly accessible to a computing device, such as processor circuitry, etc., or other circuitry disclosed herein etc. In other words, a computer-readable medium is a non-transitory memory at which one or more computing devices can access instructions, codes, data, or other information. As a non-limiting example, a computer-readable medium may include a volatile random access memory (RAM), a persistent data store such as a hard disk drive or a solid-state drive, or a combination thereof. In some embodiments, memory can be integrated with a processor, separate from a processor, or external to a computing system.

Accordingly, blocks of the block diagrams and/or flowchart illustrations support various combinations for performing the specified functions, combinations of operations for performing the specified functions and program instructions for performing the specified functions. These computer program instructions may be loaded onto one or more computer or computing devices, such as special purpose computer(s) or computing device(s) or other programmable data processing apparatus(es) to produce a specifically-configured machine, such that the instructions which execute on one or more computer or computing devices or other programmable data processing apparatus implement the functions specified in the flowchart block or blocks and/or carry out the methods described herein. Again, it should also be understood that each block of the block diagrams and flowchart illustrations, and combinations of blocks in the block diagrams and/or flowchart illustrations, or portions thereof, could be implemented by special purpose hardware-based computer systems or circuits, etc., that perform the specified functions or operations, or combinations of special purpose hardware and computer instructions.

The present application may reference quantities and numbers. Unless specifically stated, such quantities and numbers are not to be considered restrictive, but exemplary of the possible quantities or numbers associated with the present application. Also, in this regard, the present application may use the term "plurality" to reference a quantity or number. In this regard, the term "plurality" is meant to be any number that is more than one, for example, two, three, four, five, etc. The term "about," "approximately," etc., means plus or minus 5% of the stated value.

For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

Throughout this specification, terms of art may be used. These terms are to take on their ordinary meaning in the art from which they come, unless specifically defined herein or the context of their use would clearly suggest otherwise.

The drawings in the FIGURES are not to scale. Similar elements are generally denoted by similar references in the FIGURES. For the purposes of this disclosure, the same or similar elements may bear the same references. Furthermore, the presence of reference numbers or letters in the drawings cannot be considered limiting, even when such numbers or letters are indicated in the claims.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure.

In the detailed description herein, references to "one embodiment", "an embodiment", "an example embodiment", "some embodiments" etc., indicate that the embodiment or embodiments described may include a particular feature, structure, or characteristic, but every embodiment may not necessarily include the particular feature, structure, or characteristic. Moreover, such phrases are not necessarily referring to the same embodiment. In addition, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments. Thus, it will be appreciated that embodiments of the present disclosure may employ any combination of features described herein. All such combinations or sub-combinations of features are within the scope of the present disclosure.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A measurement system, the measurement system comprising:
   a measurement instrument configured to receive a radio frequency (RF) signal from a device under test, the measurement instrument including at least one analog-to-digital converter (ADC) and a digital signal processing circuit;
   at least one adjustable attenuator that is provided upstream of the at least one ADC, wherein the at least one adjustable attenuator is configured to attenuate the RF signal,
   wherein the at least one ADC is configured to receive and digitize the RF signal, thereby obtaining a digitized RF signal, and
   wherein the digital signal processing circuit is configured to:
   receive and process the digitized RF signal;
   determine whether the at least one ADC is operated in an overload operating state based on the digitized RF signal;
   determine at least one time frame of the digitized RF signal in which the at least one ADC is operated in the overload operating state, and
   determine whether the at least one time frame corresponds to a critical portion of the RF signal or to an uncritical portion of the RF signal,
   wherein the critical portions of the RF signal are portions of the RF signal that are relevant for the integrity of data to be transmitted via the RF signal, and wherein uncritical portions of the RF signal are portions of the RF signal that are not relevant for the integrity of data to be transmitted via the RF signal, and
   wherein the signal processing circuit is further configured to control the at least one adjustable attenuator to attenuate the RF signal such that the at least one ADC is operated in a nominal operating state for critical portions of the RF signal.

2. The measurement system of claim 1, wherein the digital signal processing circuit is configured to determine whether the at least one time frame corresponds to a preamble.

3. The measurement system of claim 1, wherein the digital signal processing circuit is configured to demodulate the digitized RF signal in order to determine whether the at least one time frame corresponds to a critical portion of the RF signal or to an uncritical portion of the RF signal.

4. The measurement system of claim 1, wherein the digital signal processing circuit comprises a headroom detection circuit, wherein the headroom detection circuit is configured to determine an overload magnitude in the at least one time frame.

5. The measurement system of claim 4, wherein the digital signal processing circuit is configured to determine whether the determined overload magnitude requires an enhanced attenuation of the RF signal.

6. The measurement system of claim 1, wherein the digital signal processing circuit is configured to determine whether the at least one time frame corresponds to a critical portion of the digitized RF signal or to an uncritical portion of the digitized RF signal based on a communication standard on which the RF signal is based.

7. The measurement system of claim 1, wherein the digital signal processing circuit is configured to determine at least one figure of merit of the RF signal based on the digitized RF signal.

8. The measurement system of claim 7, wherein the at least one figure of merit comprises an error vector magnitude (EVM).

9. The measurement system of claim 7, wherein the digital signal processing circuit is configured to discard portions of the digitized RF signal that correspond to the at least one time frame for determining the at least one figure of merit.

10. The measurement system of claim 7, wherein the digital signal processing circuit is configured to generate a first warning signal if the at least one time frame is critical for the at least one figure of merit.

11. The measurement system of claim 7, wherein the digital signal processing circuit is configured to generate a second warning signal if the at least one time frame is uncritical for the at least one figure of merit, or wherein the digital signal processing circuit is configured to generate no warning signal if the at least one time frame is uncritical for the at least one figure of merit.

12. The measurement system of claim 11, wherein the digital signal processing circuit is configured to generate a first warning signal if the at least one time frame is critical for the at least one figure of merit, and wherein the first warning signal is different from the second warning signal.

13. The measurement system of claim 1, wherein the measurement system further comprises a user interface, wherein the user interface is configured to receive a user input, and wherein the signal processing circuit is configured to control the at least one adjustable attenuator to attenuate the RF signal based on the received user input.

14. The measurement system of claim 1, wherein the digital signal processing circuit comprises a capture buffer, and wherein the digital signal processing circuit is configured to indicate overload samples in the capture buffer.

15. The measurement system of claim 1, wherein the at least one ADC comprises a first ADC and a second ADC, wherein the measurement system comprises a first adjustable attenuator that is provided upstream of the first ADC, wherein the measurement system further comprises a second adjustable attenuator that is provided upstream of the second ADC, and wherein the second adjustable attenuator is configured to attenuate the RF signal more than the first adjustable attenuator.

16. The measurement system of claim 15, wherein the second adjustable attenuator is configured to attenuate the RF signal such that the second ADC is operated in a nominal operating state for all portions of the RF signal.

17. The measurement system of claim 1, wherein the measurement instrument is a spectrum analyzer, a signal analyzer, an oscilloscope, or a vector network analyzer.

\* \* \* \* \*